350-317 SR
10/13/81 XR 4,294,900

United States Patent [19]
Aono

[11] 4,294,900
[45] Oct. 13, 1981

[54] PROCESS OF PRODUCING MULTICOLOR OPTICAL FILTERS

[75] Inventor: Toshiaki Aono, Minami-ashigara, Japan

[73] Assignee: Fuji Photo Film Co., Ltd., Minami-ashigara, Japan

[21] Appl. No.: 123,610

[22] Filed: Feb. 22, 1980

[30] Foreign Application Priority Data

Feb. 23, 1979 [JP] Japan .................................. 54-20265

[51] Int. Cl.$^3$ ............................ G03C 7/00; G03F 5/00

[52] U.S. Cl. ........................................ 430/7; 430/359; 430/384; 430/385; 430/386; 430/387; 430/388; 430/389; 430/390; 430/504; 430/509; 430/549; 350/317

[58] Field of Search .................... 430/7, 509, 504, 549, 430/383, 384, 385, 386, 387, 388, 389, 390, 359; 350/317

[56] References Cited

U.S. PATENT DOCUMENTS

| | | | |
|---|---|---|---|
| 2,428,054 | 9/1947 | Vittum et al. | 430/504 |
| 3,402,046 | 9/1968 | Zwick | 430/504 |
| 3,726,681 | 4/1973 | Pankow et al. | 430/504 |
| 3,811,890 | 5/1974 | Ohta et al. | 430/504 |
| 3,839,039 | 10/1974 | Suzuki et al. | 430/7 |

*Primary Examiner*—J. Travis Brown
*Attorney, Agent, or Firm*—Sughrue, Mion, Zinn, Macpeak & Seas

[57] ABSTRACT

A process for producing a multicolor optical filter by exposing a multilayer color photographic material comprising:

(1) a silver halide emulsion layer containing a colored coupler (1*b*) which has one of cyan, magenta or yellow colors and which forms a dye of one of the other two colors than the color of the colored coupler by a coupling reaction with the oxidation product of an aromatic primary amine color developing agent, and (2) a silver halide emulsion layer containing (i) a silver halide emulsion having a sufficiently high sensitivity that it can be exposed without exposing emulsion layer (1) and without increasing the color density in emulsion layer (1) and (ii) a colored coupler (2*b*) which has the same color as that of the dye formed by the coupling reaction of the colored coupler (1*b*) and which forms a cyan, magenta or yellow dye but not the color of the colored coupler (1*b*) or the color of the dye formed by the coupling reaction of the colored coupler (1*b*); the exposure is through a stripe or mosaic filter or mask having specified transmissions, and then processing the photographic material with a color developer containing an aromatic primary amine color developing agent.

The multicolor optical filters prepared are used for color pick-up tubes and color solid state pick-up devices.

8 Claims, 16 Drawing Figures

($D_1$=0.1, $D_2$=2.0, $D_3$=4.0 OR MORE)

PROCESS OF PRODUCING MULTICOLOR OPTICAL FILTERS

BACKGROUND OF THE INVENTION

1. Field of the Invention

This invention relates to a process of producing multicolor optical filters and, more particularly, to a process of producing multicolor optical filters used for color image pick-up tubes, color solid state image pick-up devices, etc.

2. Description of the Prior Art

For color image pick-up tubes or color solid state image pick-up devices such as charged coupled devices (C.C.D.) and charged injection devices (C.I.D.), multicolor stripe or mosaic form optical filters are used. A multicolor optical filter is usually composed of three colors of red, green, and blue or three colors of cyan, magenta and yellow regularly arranged in a stripe or mosaic form. At the same time the color composition of such multicolor optical filters is not always limited to three color systems and multicolor optical filters composed of two colors or four or more colors are sometimes used.

Conventional multicolor optical filters include filters prepared using dichroic mirrors as described in, for example, Japanese Patent Publication No. 8590/65 and Japanese Patent Application (OPI) No. 3440/77 (The term "OPI" as used herein refers to a "published unexamined Japanese patent application") and the filters prepared by dyeing polymer layers with dyes as described in Japanese Patent Application (OPI) Nos. 37237/72, 63739/73 and 66853/73 and Japanese Patent Publication No. 248/78 but these processes are all complicated and troublesome since a pattern must be formed for each color in the system. For example, the steps of coating a photoresist, image-wise exposure of the photoresist (which in turn involves precise alignment of a mask on the photoresist layer), development of the exposed layer, coloring/decoloring, and removing the resist, must be carried out for each color in the filter.

In practice, additional steps may be necessary to obtain excellent multicolor optical filters. For example, in the case of producing multicolor optical filters by repeating several times the steps of coating a photoresist such as gelatin dichromate, image-wise exposure, formation of relief patterns by development, and coloring; a counterplan is required to prevent the occurrence of color mixing caused when colored patterns formed in a previous coloring step mix with a different color in a subsequent coloring step. For this purpose, it may be necessary to form a protective layer which is not dyed on the surface of a pattern bearing layer in between the coloring steps as described in Japanese Patent Application (OPI) No. 37237/72, which complicates the production process and makes the cost for multicolor optical filters very high.

To overcome these difficulties, attempts using silver salt color photographic materials (herein they are simply referred to as color films) have been made. In such a process the desired multicolor optical filter is prepared by exposing a color film of a type in which the couplers are contained in the color film or of a type in which the couplers are incorporated in the developers, through red, green and blue master filters or cyan, magenta, and yellow master filters, forming a color filter composed of cyan, magenta, and yellow colors or red, green, and blue colors by an ordinary color development, sticking the color filter on a glass disc such as a face plate of an image pick-up tube or camera tube, and further applying thereon a thin glass plate. In the color film used in the above-described process, the size of silver halide grains in the silver halide emulsion layers is considerably large and also the silver halide emulsion layers are in a multilayer structure, each having a sensitivity in each spectral wavelength region. Consequently, scattering of light in the silver halide emulsion layers is severe and hence the resolving power of the color film is not so high.

Also, Japanese Patent Application No. 78313/78 discloses a technique of obtaining a very high resolving power using a combination of a photographic material having conventional black-and-white fine grain silver halide emulsions and color development of the type in which the couplers are incorporated in the developers. However, this technique requires at least three light exposure and color development steps and hence is very complicated.

Furthermore, in conventional processes it is necessary to use a specific mask in which red, green, and blue filters are arranged in a mosaic form for exposure and complicated steps are required to make the mask precise.

SUMMARY OF THE INVENTION

An object of this invention is to provide a process of producing multicolor optical filters suitable for use in color pick-up tubes or color solid state pick-up devices at a low cost by employing simple steps as in the case of processing photographic films.

Another object of this invention is to provide a process of producing multicolor optical filters suffering less light scattering through the silver halide emulsion layers and having high resolving power.

Still another object of this invention is to provide a process of producing multicolor optical filters without the above defects.

The above objects of this invention can be attained by a process which comprises: (a) exposing a multilayer color photographic material comprising:

(1) a silver halide emulsion layer containing a colored coupler (1*b*) which has one of the three principal colors in a subtractive color process (i.e., cyan, magenta or yellow) and which forms a dye having one of the remaining two principal colors by coupling reaction with the oxidation product of an aromatic primary amine color developing agent, and (2) a silver halide emulsion layer containing (i) a silver halide emulsion (2*a*) having sufficiently high sensitivity that it can be exposed without exposing emulsion layer (1) and without increasing the color density in emulsion layer (1) upon development and (ii) a colored coupler (2*b*) which has the same color as that of the dye formed by coupling reaction of the colored coupler (1*b*) in emulsion layer (1), and which forms a dye having one of the three principal colors in a subtractive color process other than the color of the colored coupler (1*b*) in the emulsion layer (1) and the color of the dye formed by the coupling reaction of the colored coupler (1*b*), said exposure being such that a portion of the surface is unexposed, and no image-wise development occurs in the silver halide emulsion layer (2), a portion of the surface is exposed in an amount sufficient to expose silver halide emulsion layer (2) without exposing emulsion layer (1) such that no image-wise development occurs in the silver halide emulsion layer (1), and the remaining portion is exposed in an amount sufficient to produce image-wise development of silver halide emulsion layer (1), and (b) processing the color photographic material in a color developer containing an aromatic primary amine color developing agent, preferably a p-phenylenediamine color developing agent.

DETAILED DESCRIPTION OF THE INVENTION

To accomplish exposure in accordance with this invention, it is particularly preferred to use a transmitting filter wherein (i) some areas do not transmit an amount of light sufficient to produce a color (image) in silver halide emulsion layer (2), (ii) some areas transmit enough light to completely color silver halide emulsion layer (2) but not enough to color silver halide emulsion layer (1), and (iii) the balance of the areas transmit sufficient light to completely color silver halide emulsion layer (2) and silver halide emulsion layer (1), these areas are distributed corresponding to the pattern of red, green and blue colors desired in the multicolor optical filter prepared by the process of this invention.

The invention will be explained in more detail by reference to the accompanying drawings.

Figure 1:
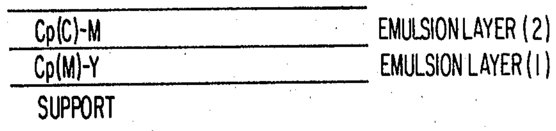
FIG. 1 shows one embodiment of the color photographic material used in this invention.

In FIG. 1, Cp(C)-M is a magenta colored cyan coupler and Cp(M)-Y is a yellow colored magenta coupler. That is, when Cp(C)-M is reacted with the oxidation product of an aromatic primary amine color developing agent, Cp(C)-M is converted into a cyan dye.

Figure 2:
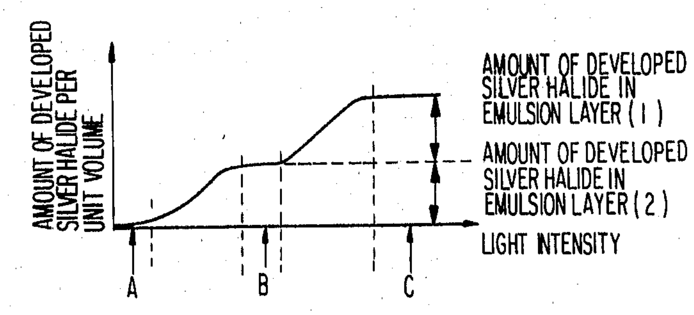
FIG. 2 is the characteristic curve of the photographic material shown in FIG. 1 subjected to a black-and-white development.
Figure 3:
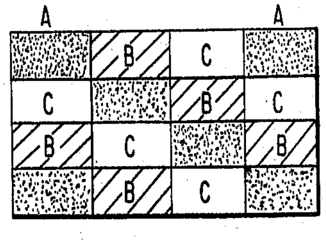
FIG. 3 shows an embodiment of a neutral filter used in the practice of this invention, wherein portions A, B and C provide the transmission densities shown at A, B and C respectively in FIG. 2 under a certain exposure.
Figure 4:
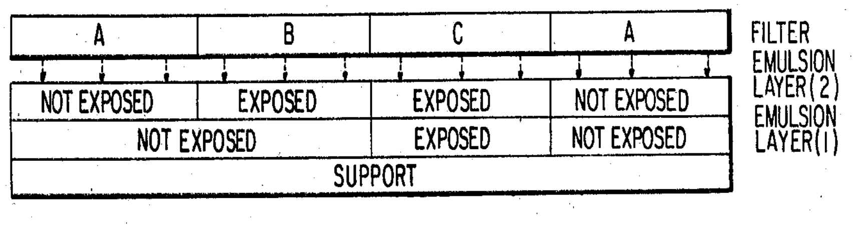
FIG. 4 shows exposure of the exposed photographic material of FIG. 2.

The sensitivities of the silver halide emulsion layer (1) and the silver halide emulsion layer (2) of the photographic material in FIG. 1 preferably have the characteristic curve (where the photosensitive material of FIG. 1 is exposed through a continuous wedge and developed in a black-and-white developer) shown in FIG. 2. When the photographic material having the characteristics shown in FIG. 2 is exposed through a transmitting filter (illustrated in FIG. 3) wherein areas providing the densities at A, B and C in the characteristic curve shown in FIG. 2 are arranged in a mosaic form and the material is color-developed, the result shown in FIG. 4 is obtained. In this case, each portion is colored as shown in FIG. 5.

Figure 5:
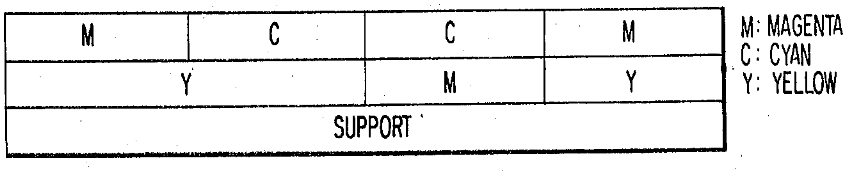
FIG. 5 shows a color distribution after coupling reaction.
Figure 6:
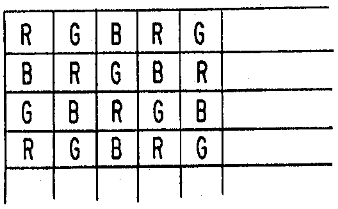
FIG. 6 is a color distribution of a multicolor filter obtained in this invention using the color photographic material shown in FIG. 1 and the filter shown in FIG. 3.

When the photographic material processed and colored as shown in FIG. 5 is irradiated by white light, the light transmitted through the magenta colored portion and the yellow colored portion of the photographic material is red; through the cyan colored portion and the yellow colored portion is green; and through the magenta colored portion and the cyan colored portion is blue. Thus, when the photographic material shown in FIG. 1 is irradiated with white light using the filter shown in FIG. 3, the portion A of the photographic material is colored red, the portion B green, and the portion C blue to provide a multicolor optical filter having the red, green and blue pattern shown in FIG. 6.

As described above, the pattern of red, green and blue colors in the multicolor optical filter is determined by the filter areas each of which transmits a different density of light.

Thus, a neutral filter having the appropriate pattern of areas, each having a different filter density corresponding to the desired multicolor optical filter may be selected. For example, for producing a multicolor striped optical filter, a filter having a striped density distribution may be used and for producing a multicolor mosaic optical filter, a filter having a mosaic density distribution may be used.

In the case of making a striped multicolor optical filter, the following process may also be employed. That is, a three color striped optical filter can be produced by exposing the photographic material using an optical wedge wherein portions (stripes) which are impermeable to light and transparent portions twice as wide as the light impermeable portions are arranged alternately in stripe form, and then after shifting the optical wedge in a direction perpendicular to the stripe the same distance as the width of the light impermeable portion, the photographic material is exposed again.

The light exposure process described in *Hyomen* (*Surface*), Vol. 15, No. 2, 91–95 (1977) can be used to make the filter used for subsequently exposing the two layer color photographic material used in the present invention. For example, the filter (herein, the term "filter" refers to the device used in exposing the photographic material) can be obtained by vapor depositing chromium on a glass sheet, coating a resist polymer on the vapor-deposited chromium layer, and then etching the polymer layer by the process described in the above reference. Contact printing is possible with the filter thus obtained. A filter can also be obtained by size-reducing printing a desired pattern on a photographic material prepared by coating a silver halide emulsion on a support such as a glass plate or a polyethylene terephthalate film through a lens.

The photographic material used in this invention may be subjected to contact exposure through the filter thus obtained by controlling the exposure amount in conformity with the above-mentioned exposure conditions. In this case, the photographic material may be exposed to white light or blue light. Furthermore, when the silver halide emulsions used in this invention have been color sensitized, green light or red light may be used as the exposure light.

A filter having a relatively large pattern may be reduction printed using a lens and this method is simple and convenient for the production of the filter.

Examples of combinations of colored couplers forming the photographic materials employed in the process of this invention are shown below:

| | Emulsion layer (2) | Emulsion layer (1) |
|---|---|---|
| (1) | Magenta colored yellow coupling coupler | Cyan colored magenta coupling coupler |
| (2) | Magenta colored cyan coupling coupler | Yellow colored magenta coupling coupler |
| (3) | Cyan colored magenta coupling coupler | Yellow colored cyan coupling coupler |
| (4) | Cyan colored yellow coupling coupler | Magenta colored cyan coupling coupler |
| (5) | Yellow colored magenta coupling coupler | Cyan colored yellow coupling coupler |
| (6) | Yellow colored cyan coupling coupler | Magenta colored yellow coupling coupler |

The terms "cyan color", "magenta color", and "yellow color" are used herein as they are customarily used in the field of photographic materials and have definite meanings. Their definition is described in, for example, Spencer, *The Forcal Dictional of Photographic Technologies* (published by Focal Press Co., London).

The relation between the sensitivities of the silver halide emulsion layer (1) and the silver halide emulsion layer (2) in the photographic materials used in the process of this invention preferably provides the characteristic curve shown in FIG. 2 when the photographic material is developed by a black-and-white developer. There is no limitation about the coating order of the silver halide emulsion layer (1) and the silver halide emulsion layer (2) on a support and each of the emulsion layer (1) and emulsion layer (2) may be composed of two or more layers.

The sensitivity relationship between emulsion layers (1) and (2) is such that emulsion layer (2) has a higher sensitivity than emulsion layer (1) such that at certain exposures emulsion layer (2) is exposed but emulsion layer (1) is unexposed, whereas at higher exposures, emulsion layer (2) and emulsion layer (1) are exposed. Referring to FIG. 3, three situations arise.

A: No exposure.

B: Emulsion layer (2) is exposed whereby a dye image is formed in emulsion layer (2), but emulsion layer (1) is unexposed and no dye image is formed in emulsion (1).

C: Emulsion layers (1) and (2) are exposed such that dye images are formed in each layer. There are some light intensities which will produce partial exposure of emulsion layer (1) in B and the filter should be designed to transmit light intensities such that partial exposure of emulsion layer (1) does not occur upon exposure of emulsion layer (2) in B. That is the transmission of the filter is ideally limited to the plateaus of FIG. 2 as much as possible. Furthermore, emulsion layers which do not have exactly the stepwise relationship in sensitivity shown in FIG. 2 can be used in the present invention if the densities in the areas A, B and C of the filter are appropriately limited.

The silver halide photographic emulsion used in the present invention can be prepared according to the processes described in P. Glafkides, *Chimie et Physique Photographique* (Paul Montel, 1967), G. F. Duffin, *Photographic Emulsion Chemistry* (published by The Focal Press in 1966), V. L. Zelikman et al., *Making and Coating Photographic Emulsion* (published by The Focal Press in 1964), etc. That is, silver halide emulsions prepared according to any of an acidic process, neutral process, and ammoniacal process may be used. As the manner of reacting a soluble silver salt with a soluble halide, any of one-side mixing process, simultaneously mixing process, combination thereof, etc., may be employed.

It is also possible to employ the process of forming grains in the presence of excess silver ion (so-called reverse-mixing process). As one of the simultaneously mixing processes, a process of maintaining the pAg of the liquid phase in which silver halide is formed at a constant level, i.e, so-called controlled double jet process, can be used.

This process provides a silver halide emulsion containing silver halide grains having a regular crystal form and an approximately uniform particle size.

It is further possible to mix and use two or more silver halide emulsions separately prepared.

During the formation or physical ripening of silver halide grains, cadmium salts, zinc salts, lead salts, thallium salts, iridium salts or complex salts thereof, rhodium salts or complex salts thereof, iron salts or complex salts thereof, etc., may be allowed to be copresent in the system. The silver halide grain may have different phases on the inside of the grain and the outside surface or the grain may have a homogeneous phase. Also, the latent image may form predominately on the outside surface or in the inside of the silver halide grains.

The silver halide photographic emulsion layer used in the present invention may contain, for example, a polyalkyleneoxide or ether derivatives thereof, ester derivatives thereof and amine derivatives thereof, etc., a thioether compound, a thiomorpholine, a quaternary ammonium salt compound, a urethane derivative, a urea derivative, an imidazole derivative, a 3-pyrazolidone, etc., to increase sensitivity or contrast or to accelerate development. For example, the compounds described in U.S. Pat. Nos. 2,400,532, 2,423,549, 2,716,062, 3,617,280, 3,772,021 and 3,808,003, British Pat. No. 1,488,991, etc., can be used.

The photographic emulsion used in the present invention may be spectrally sensitized with methine dyes, or the like. Suitable dyes include cyanine dyes, merocyanine dyes, complex cyanine dyes, complex merocyanine dyes, holopolar cyanine dyes, hemicyanine dyes, styryl dyes, hemioxonol dyes, etc. Particularly useful dyes are those belonging to cyanine dyes, merocyanine dyes, and complex merocyanine dyes. These dyes may contain as basic heterocyclic nucleus any of nuclei usually used for cyanine dyes, that is, they can containe a pyrroline nucleus, an oxazoline nucleus, a thiazoline nucleus, a pyrrole nucleus, an oxazole nucleus, a thiazole nucleus, a selenaxole nucleus, an imidaxole nucleus, a tetrazole nucleus, a pyridine nucleus, etc.; a nucleus having a condensed alicyclic hydrocarbon ring or rings; and a nucleus having a condensed aromatic hydrocarbon ring or rings such as an indolenine nucleus, a benzindolenine nucleus, an indole nucleus, a benzoxazole nucleus, a naphthoxazole nucleus, a benzothiazole nucleus, a naphthothiazole nucleus, a benzoselenazole nucleus, a benzimidazole nucleus, a quinoline nucleus, etc. These nuclei may be substituted on the carbon atom or atoms thereof.

Merocyanine dyes or complex merocyanine dyes contain, as a ketomethylene structure-containing nucleus, a 5-or 6-membered heterocyclic nucleus such as a pyrazolin-5-one nucleus, a thiohydantoin nucleus, a 2-thiooxazolidin-2,4-dione nucleus, a thiazolidin-2,4-dione nucleus, a rhodanine nucleus, a thiobarbituric acid nucleus, or the like.

Useful sensitizing dyes are described in, for example, German Pat. No. 929,080, U.S. Pat. Nos. 2,231,658, 2,493,748, 2,503,776, 2,519,001, 2,912,329, 3,656,959, 3,672,897, 3,694,217, 4,025,349, 4,046,572, British Pat. No. 1,242,588, Japanese Patent Publication Nos. 14030/69, 2484/77, etc.

These sensitizing dyes may be used alone or in combination. A combination of sensitizing dyes is often used for attaining, in particular, supersensitization. Typical examples thereof are described in U.S. Pat. Nos. 2,688,545, 2,977,229, 3,397,060, 3,522,052, 3,527,641, 3,617,293, 3,628,964, 3,666,480, 3,672,898, 3,679,428, 3,703,377, 3,769,301, 3,814,609, 3,837,862, 4,026,707, British Pat. Nos. 1,344,281, 1,507,803, Japanese Patent Publication Nos. 4936/68, 12375/78, Japanese Patent Application (OPI) Nos. 110618/77, 109925/77, etc.

Dyes which themselves do not show a spectrally sensitizing action or materials which do not substantially absorb visible light, showing supersensitivity, may be incorporated in the emulsion together with the sensitizing dyes. For example, aminostilbenes substituted by a nitrogen-containing heterocyclic group (for example, those described in U.S. Pat. Nos. 2,933,390 and 3,635,721), aromatic organic acid-formaldehyde condensates (for example, those described in U.S. Pat. No. 3,743,510), cadmium salts, azaindene compounds, etc., may be incorporated. Combinations described in U.S. Pat. Nos. 3,615,613, 3,615,641, 3,617,295, and 3,635,721 are particularly useful.

Differences in sensitivity between the high sensitivity emulsion layer (2) and the low sensitivity emulsion layer (1) of FIG. 1 can generally be adjusted by adjusting physical aging, chemical aging, sensitizer content, etc. When these layers are exposed by visible light, it can be adjusted with the kind of color sensitizer, the content thereof, or the content of a dye which can decrease the emulsion sensitivity and which can be dissolved from the photographic layer during development.

Examples of suitable colored couplers are described in, for example, U.S. Pat. Nos. 2,521,908, 3,034,892, 3,227,550, 3,476,560, 3,644,498, U.S. Defense Application No. 900,029, British Pat. No. 1,330,524, Japanese Patent Publication Nos. 22335/63, 11304/67, 2016/69 and 32461/69, Japanese Patent Application (OPI) Nos. 26034/76, 133021/76 and 42121/77 and West German Patent Application (OLS) No. 2,418,959.

Among these compounds, practical examples of the colored couplers used advantageously in this invention are shown below:

Cyan Colored Magenta Couplers:

(1)

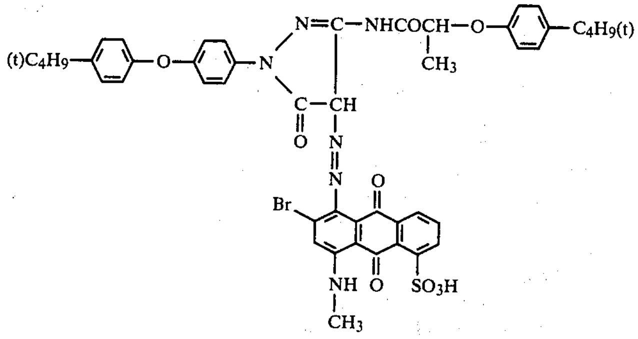

(2)

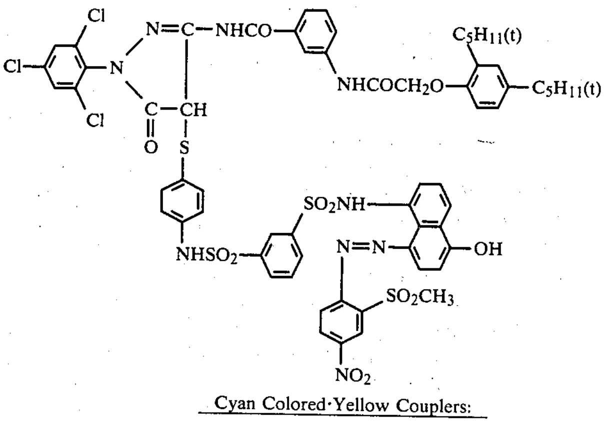

Cyan Colored·Yellow Couplers:

-continued
(3)
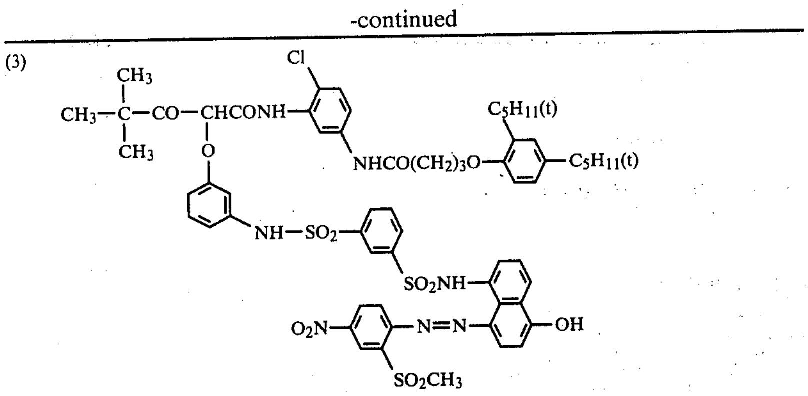
(4)
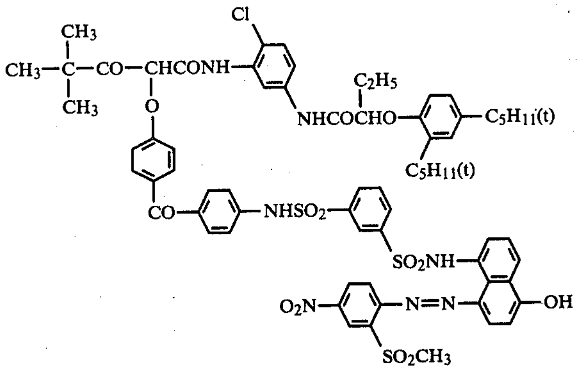
Magenta Colored Cyan Couplers:
(5)
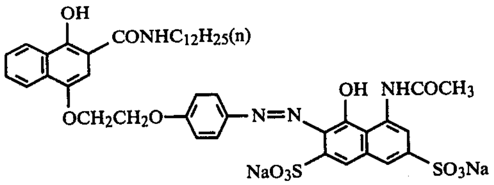
(6)
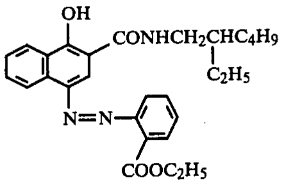
(7)
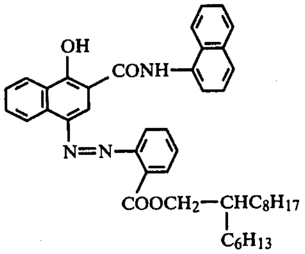
Magenta Colored Yellow Couplers:
(8)
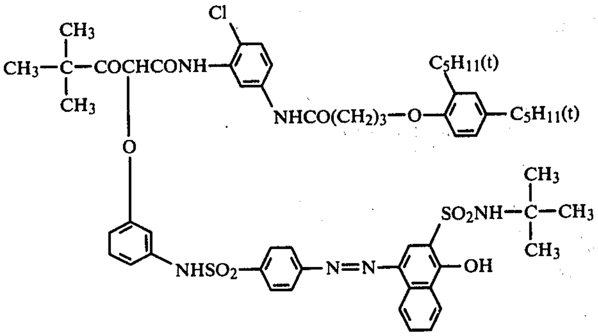

-continued
(9)
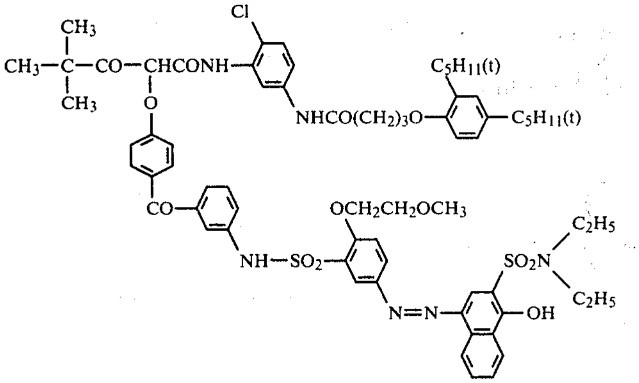
(10)
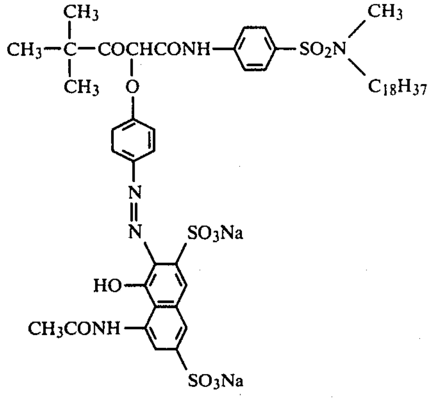
Yellow Colored Cyan Couplers:
(11)
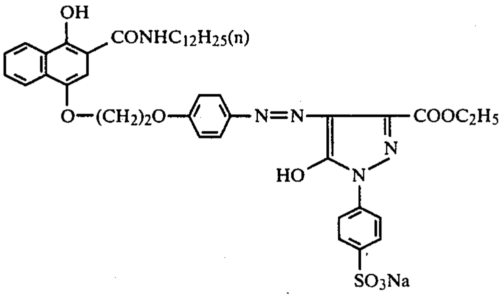
(12)
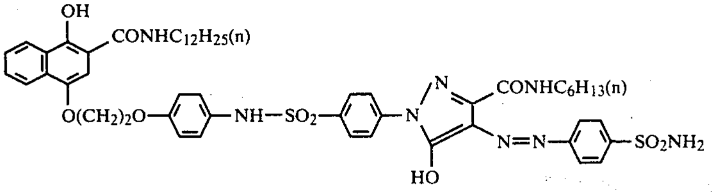
Yellow Colored Magenta Couplers:
(13)
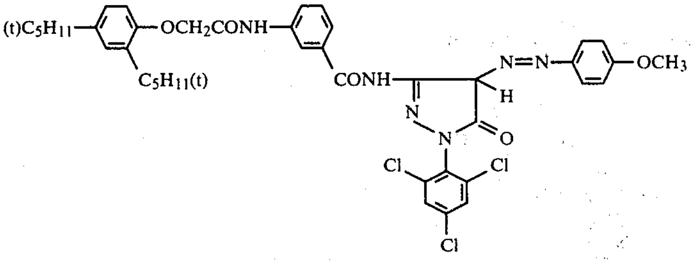

-continued (14)

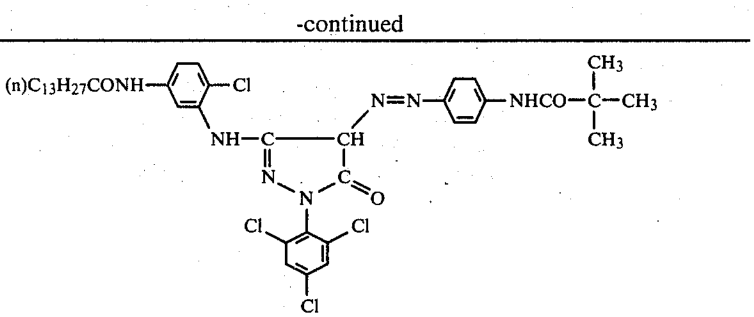

(15)

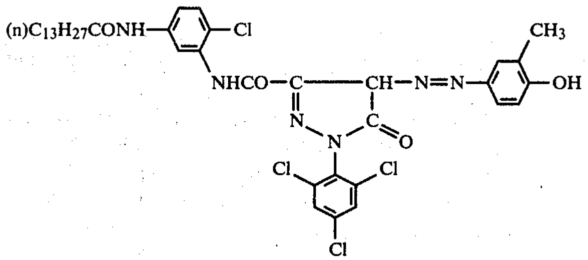

In the practice of this invention, the colored couplers can be used together with ordinary uncolored couplers other than the colored couplers for increasing the densities of cyan, magenta, and yellow colors in this invention.

It is preferred that the couplers used in this invention are non-diffusible having a so-called "ballast group" (hydrophobic group) in the molecule. The couplers used in this invention may be four equivalent couplers or two equivalent couplers. Furthermore, colored couplers having a color correction effect or couplers releasing development inhibitors with the progress of development (so-called DIR couplers) may be used. Still further, the couplers used in this invention may form colorless products by coupling reactions.

As the yellow couplers (i.e., couplers forming a yellow dye upon development), various known open chain type ketomethylene couplers can be used in this invention. Among these couplers, benzoylacetanilide series compounds and pivaloylacetanilide series compounds are advantageous. Practical examples of the yellow couplers used in this invention are described in, for example, U.S. Pat. Nos. 2,875,057, 3,265,506, 3,408,194, 3,551,155, 3,582,322, 3,725,072 and 3,891,445, West German Pat. No. 1,547,868, West German Patent Application (OLS) Nos. 2,219,917, 2,261,361 and 2,414,006, British Pat. No. 1,425,020, Japanese Patent Publication No. 10783/76, Japanese Patent Application (OPI) Nos. 26133/72, 73147/73, 102636/76, 6341/75, 123342/75, 130442/75, 21827/76, 87650/75, 82424/77 and 115219/77.

As the magenta couplers, pyrazolone compounds, indazolone compounds, and cyanoacetyl compounds can be used but pyrazolone compounds are particularly advantageous in this invention. Practical examples of the magenta coupling couplers used in this invention are described in, for example, U.S. Pat. Nos. 2,600,788, 2,983,608, 3,062,653, 3,127,269 3,311,476, 3,419,391, 3,519,429, 3,558,319, 3,582,322, 3,615,506, 3,834,908 and 3,891,445, West German Pat. No. 1,810,464, West German Patent Application (OLS) Nos. 2,408,665, 2,417,945, 2,418,959 and 2,424,467, Japanese Patent Publication Nos. 6031/65 and 45990/76, and Japanese Patent Application (OPI) Nos. 20826/76, 58922/76, 129538/74, 74027/74, 159336/75, 42121/77, 74028/74, 60233/75, 26541/76 and 55122/78.

As the cyan coupling couplers, phenols compounds, naphthols compounds, etc., can be used in this invention. Practical examples of these couplers are described in, for example, U.S. Pat. Nos. 2,369,929, 2,434,272, 2,474,293, 2,521,908, 2,895,826, 3,034,892, 3,311,476, 3,458,315, 3,476,563, 3,583,971, 3,591,383, 3,767,411 and 4,004,929, West German Patent Application (OLS) Nos. 2,414,830 and 2,454,329, and Japanese Patent Application (OPI) Nos. 59838/73, 26034/76, 5055/73, 146828/76, 69624/77 and 90932/77.

The mother nucleus of preferred cyan couplers for use in the present invention are represented by the following formulae (C-I) and (C-II):

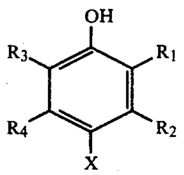

(C-I)

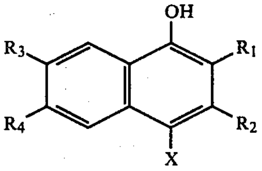

(C-II)

In the above formulae, $R_1$ represents a hydrogen atom, an aliphatic group, an alkoxy group, an aryloxy group, an acylamido group, a sulfonamido group, a phosphamido group, a ureido group or a carbamyl group. Each of the above-described groups may be substituted or unsubstituted and have up to 30 carbon atoms. But $R_1$ is not limited by the substituents described above. $R_2$, $R_3$ and $R_4$ each represents a hydrogen atom, a halogen atom, an alkyl group, an aryl group, an alkoxy group, an alkylthio group, a heterocyclic group, an amino group, a carbonamido group, a sulfonamido group, a sulfamoyl group or a carbamoyl group.

As the mother nucleus of the preferred magenta couplers for use in the present invention, there can be used compounds of the pyrazolone series, the pyrazolinobenzimidazole series, the pyrazolotriazole series, the indazolone series etc. Of these compounds, the magenta coupler which gives superior photographic characteristics is represented by the following formulae (M-I) and (M-II):

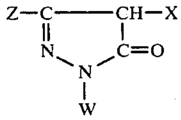

(M-I)

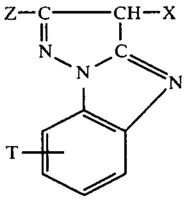

(M-II)

In the above formulae, W represents a hydrogen atom, an alkyl group, an alkenyl group, a cycloalkyl group, an aralkyl, a cycloalkenyl group or aryl group, or a heterocyclic group (for example, a 5- or 6-membered heterocyclic or condensed heterorcyclic group having one or more hetero atoms such as a nitrogen atom, an oxygen atom, a sulfur atom). Each of the above-described groups may be straight or branched chain and have 1 to 35, preferably 1 to 22, carbon atoms and have one or more substituents. Further, W represents an acyl group, a thioacyl group, an alkylsulfonyl group, an arylsulfonyl group, an alkylsulfinyl group, a carbamoyl group or a thiocarbamoyl group. Z represents a hydrogen atom, an alkyl group, an alkenyl group, a cycloalkyl group, an aralkyl group, a cycloalkenyl group or an aryl group, or a heterocyclic group. Each of the above-described groups may be straight or branched chain, have 1 to 35, preferably 1 to 22 carbon atoms and have one or more substituents. Further, Z represents an alkoxycarbonyl group, an aryloxycarbonyl group, an aralkyloxycarbonyl group, an alkoxy group, an aryloxy group, an alkylthio group, an arylthio group, a carboxy group, an acylamino group, a diacylamino group, an N-alkylacylamino group, an N-arylacylamino group, a ureido group, a thioureido group, a urethane group, a thiourethane group, an anilino group, an alkylamino group, a cycloamino group, an alkylcarbonyl group, an arylcarbonyl group, a sulfonamido group, a carbamoyl group, a sulfamoyl group, a guanidino group, a cyano group, an acyloxy group, a sulfonyloxy group, a hydroxy group, a mercapto group, a halogen atom or sulfone group; T represents a hydrogen atom, an alkyl group, an alkenyl group, a cycloalkyl group, an aralkyl group, a cycloalkenyl group or an aryl group, or a heterocyclic group. Each of the above-described groups may be straight or branched chain, have 1 to 35, preferably 1 to 22 carbon atoms and have one or more substituents. Further, T represents a cyano group, an alkoxy group, an aryloxy group, a halogen atom, a carboxy group, an alkoxycarbonyl group, an aryloxycarbonyl group, an acyloxy group, an alkylcarbonyl group, an arylcarbonyl group, an alkylthiocarbonyl group, an arylthiocarbonyl group, a sulfo group, a sulfamoyl group, a carbamoyl group, an acylamino group, a diacylamino group, a ureido group, a thioureido group, a urethane group, a thiourethane group, a sulfonamido group, an alkylsulfonyloxy group, an arylsulfonyloxy group, an arylsulfonyl group, an alkylsulfonyl group, an arylthio group, an alkylthio group, an alkylsulfinyl group, an arylsulfinyl group, an alkylamino group, a dialkylamino group, an anilino group, an N-arylanilino group, an N-alkylanilino group, an N-acylanilino group, a hydroxy group or a mercapto group.

Also, yellow couplers for use in the present invention are represented by the following formula (Y):

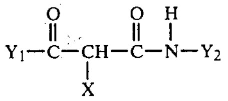

(Y)

wherein $Y_1$ represents an aliphatic group, an aromatic group or a heterocyclic group; and $Y_2$ represents an aromatic group or a heterocyclic group.

In the Formulae (C-I), (C-II), (M-I), (M-II) and (Y) described above, X represents a coupling-off group, a dye moiety or a dye precursor moiety which combines with the above-described coupler directly or through a connecting group L. L represents a group such as an alkylene group having 1 to 6 carbon atoms (or alkylidene group), an arylene group or a heterocyclic group and L may combine with X directly or through a group such as —O—, —S—, $-SO_2-$, $-NR_0-$ ($R_0$ represents a hydrogen atom or an alkyl group), —CO—, —CO—NH—, $-SO_2-NH-$ or

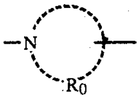

(a heterocyclic group).

The above-described dye moiety, in principle, may be a moiety of optional kinds of dyes. However, the dye moiety must have a sufficient diffusibility to be dissolved from the photographic material through photographic layers during development.

This object is accomplished by combining one or more water-soluble groups with the dye moiety, if it is necessary. Suitable examples of water-soluble groups are, for example, a carboxy group, a sulfo group, a sulfonamido group, a sulfamoyl group, an aliphatic or aromatic hydroxy-containing group.

Suitable examples of the dye used in the present invention are, for example, an azo dye, an azomethine dye, an anthraquinone dye, a phthalocyanine dye, an indigoid dye, a triphenylmethane dye, a metal complex dye, a colored metal complex.

The dye precursor described above represents a moiety of a compound which can be changed to a dye in the color system by liberation of an auxochrome (i.e., to join in chromogen by a liberation of the auxochrome) by oxidation in a conventional processing step or an additional processing step during photographic processing. The dye precursor may be a leuco dye or a dye which can be changed to another dye during photographic processing. According to the purpose, the dye or the dye precursor having each hue of cyan, magenta or yellow can be selected.

To control the granularity of the silver halide emulsions as well as the sharpness and hue of the photographic materials, the compounds releasing development inhibitors at development (DIR compounds or DIR couplers) may be used in this invention. As DIR couplers, the couplers described in, for example, U.S.

Pat. Nos. 3,227,554, 3,617,291, 3,701,783, 3,790,384 and 3,632,345, West German Patent Application (OLS) Nos. 2,414,006, 3,454,301 and 2,454,329, British Pat. No. 953,454, Japanese Patent Application (OPI) Nos. 69624/77 and 122335/74 and Japanese Patent Publication No. 16141/76 can be used. Alternatively, the photographic materials used in this invention may contain compounds releasing development inhibitors at development in place of the DIR couplers described above. Examples of the DIR compounds are described in, for example, U.S. Pat. Nos. 3,297,445 and 3,379,529, West German Patent Application (OLS) No. 2,417,914 and Japanese Patent Application (OPI) Nos. 15271/77 and 9116/73.

The couplers described above may be incorporated in one silver halide emulsion layer in combination or the same coupler may be incorporated in two or more silver halide emulsion layers.

The amount of the coupler incorporated in a silver halide emulsion layer is usually $2\times10^{-3}$ mol to $5\times10^{-1}$ mol, preferably $1\times10^{-2}$ mol to $5\times10^{-1}$ mol per mol of silver in the emulsion layer.

The above-described couplers are introduced into silver halide emulsions by known methods such as described in U.S. Pat. No. 2,322,027. For example, the coupler is dissolved in a high boiling solvent such as phthalic acid alkyl ester (e.g., dibutyl phthalate, dioctyl phthalate, etc.), a phosphoric acid ester (e.g., diphenyl phosphate, triphenyl phosphate, tricresyl phosphate, dioctylbutyl phosphate, etc.), a citric acid ester (e.g., tributyl acetylcitrate, etc.), a benzoic acid ester (e.g., octyl benzoate, etc.), an alkylamide (e.g., diethyl laurylamide, etc.), a fatty acid ester (e.g., dibutoxyethyl succinate, dioctyl azelate, etc.), and the like or an organic solvent having a boiling point of from about 30° C. to about 150° C., such as a lower alkyl acetate (e.g., ethyl acetate, butyl acetate, etc.), ethyl propionate, secondary butyl alcohol, methyl isobutyl ketone, β-ethoxyethyl acetate, methyl cellosolve, etc., and then the solution of the coupler is dispersed in an aqueous solution of a hydrophilic colloid. In this case, the above-mentioned high boiling organic solvent and the low boiling organic solvent may be used as a mixture thereof.

When the coupler possesses an acid group such as a carboxy group and a sulfone group, the coupler is introduced into an aqueous solution of a hydrophilic colloid as an alkaline aqueous solution of it.

In the photographic materials used in this invention, the silver halide photographic emulsion layers and other layers are coated on plastic films or flexible supports usually used for photographic materials as well as solid supports such as glasses, porcelains, quartz, sapphire, metals, etc. Useful flexible supports are films of cellulose nitrate, cellulose acetate, cellulose acetate butyrate, polystyrene, polyvinyl chloride, polyethylene terephthalate, polycarbonate, etc.

Also, the support may have a function other than as the support itself or may be the face plate of a pick-up tube.

The surfaces of these supports are generally coated with subbing layers to improve the adhesion for silver halide photographic emulsion layers, etc. Furthermore, the surfaces of the supports may be subjected to corona discharge treatment, ultraviolet irradiation treatment, flame treatment, etc., before or after the subbing treatment. As the materials used for the subbing layers, there are gelatin, albumin, casein, cellulose derivatives, starch derivatives, sodium alginate, polyvinyl alcohol, polyvinyl pyrrolidone, polyacrylic acid copolymers, polyacrylamide, etc. To obtain the same effect as a subbing layer, a very small amount of a hydrophilic material such as chromium, etc., may be applied onto the surfaces of the supports. The application of chromium and the like onto the surfaces of supports is performed by vacuum deposition, sputtering, ion plating, etc., at an optical density of less than 0.1, preferably less than 0.08.

In the photographic materials of this invention, the silver halide emulsion layers or other layers may further contain a dispersion of a synthetic polymer which is insoluble or sparingly soluble in water to improve their dimensional stability, etc. Typical examples of such a polymer are homopolymers or copolymers of an alkyl acrylate, an alkyl methacrylate, an alkoxyalkyl acrylate, an alkoxyalkyl methacrylate, glycidyl acrylate, glycidyl methacrylate, acrylamide, methacrylamide, a vinyl ester (e.g., vinyl acetate), acrylonitrile, an olefin, styrene, etc.; or copolymers of the above and acrylic acid, methacrylic acid, an α,β-unsaturated dicarboxylic acid, a hydroxyalkyl acrylate, a hydroxyalkyl methacrylate, a sulfoalkyl acrylate, a sulfoalkyl methacrylate, styrenesulfonic acid, etc., can be used. They are practically described in, for example, U.S. Pat. Nos. 2,376,005, 2,739,137, 2,853,457, 3,062,674, 3,411,911, 3,488,708, 3,525,620, 3,607,290, 3,635,715 and 2,645,740, and British Pat. Nos. 1,186,699 and 1,307,373.

As a binder or a protective colloid for silver halide photographic emulsions, gelatin is advantageously used but hydrophilic colloids other than gelatin can also be used.

Examples of such hydrophilic colloids are gelatin derivatives; graft polymers of gelatin and other polymers; proteins such as albumin, casein, etc.; cellulose derivatives such as hydroxyethyl cellulose, carboxymethyl cellulose, cellulose sulfuric acid ester, etc.; sugar derivatives such as sodium alginate, starch derivatives, etc.; and various synthetic hydrophilic polymers such as the homopolymers or copolymers of, for example, polyvinyl alcohol, the partial acetal of polyvinyl alcohol, poly-N-vinylpyrrolidone, polyacrylic acid, polymethacrylic acid, polyacrylamide, polyvinylimidazole, polyvinylpyrazole, etc.

As the gelatin used in this invention, lime-processed gelatin, acid-processed gelatin, enzym-processed gelatin as described in *Bull. Soc. Sci. Phot. Japan,* No. 16, 30 (1966), and the hydrolyzed product or enzyme-decomposition product of gelatin. As the gelatin derivatives used in this invention, there are the reaction products of gelatin and acid halides, acid anhydrides, isocyanates, bromoacetic acid, alkanesultones, vinylsulfonamides, maleinimide compounds, polyalkylene oxides, epoxy compounds, etc. Practical examples of these materials are described in U.S. Pat. Nos. 2,614,928, 3,132,945, 3,186,846, 3,312,553 and British Pat. Nos. 861,414, 1,033,189 and 1,005,784, and Japanese Patent Publication No. 26845/67.

Also, as the gelatin graft polymers described above, there are polymers prepared by grafting the homopolymers or copolymers of acrylic acid, methacrylic acid, the esters thereof, the amide derivatives thereof, acrylonitrile, styrene, etc., to gelatin. In particular, the graft polymers of gelatin and polymers having compatibility with gelatin to some extent, such as the polymers of acrylic acid, methacrylic acid, acrylamide, methacrylamide, hydroxyalkyl methacrylate, etc., are preferred and practical examples of them are described in, for example, U.S. Pat. Nos. 2,763,625, 2,831,767 and 2,956,884.

Typical examples of the synthetic hydrophilic polymers are described in, for example, West German Patent Application (OLS) No. 2,312,708, U.S. Pat. Nos. 3,620,751 and 3,879,205 and Japanese Patent Publication No. 7561/68.

The silver halide photographic layers of the photographic materials used in this invention may further contain known surface active agents as coating aids, antistatic agents, etc., for improving slipping property, emulsion dispersibility, prevent adhesion, and photographic properties (e.g., development acceleration, hardening, sensitization, etc.). Examples of these surface active agents are nonionic active agents such as saponin (steroid series), alkylene oxide derivatives (e.g., polyethylene glycol, polyethylene glycol/polypropylene glycol condensation products, polyethylene glycol alkyl ethers, polyethylene glycol alkylaryl ethers, polyethylene glycol esters, polyethylene glycol sorbitan esters, polyalkylene glycol alkylamines, polyalkylene glycol alkylamides, polyethylene oxide addition products of silicone, etc.), glycidol derivatives (e.g., polyglyceride alkenylsuccinate, alkylphenol polyglyceride, etc.), fatty acid esters of polyhydric alcohols, sugar alkyl esters, sugar alkyl urethanes, sugar alkyl ethers, etc.; anionic surface active agents having acid groups such as a carboxy group, a sulfo group, a phospho group, a sulfuric acid ester group, a phosphoric acid ester group, etc., such as triterpenoid series saponins, alkylcarboxylates, alkylsulfonates, alkylbenzenesulfonates, alkylnaphthalenesulfonates, alkylsulfuric acid esters, alkylphosphoric acid esters, N-acyl-N-alkyltaurines, sulfosuccinic acid esters, sulfoalkylpolyoxyethylene alkylphenyl ethers, polyoxyethylene alkylphosphoric acid esters, etc.; amphoteric surface active agents such as aminoacids, aminoalkylsulfonic acids, aminoalkylsulfuric acid esters, aminoalkyl phosphoric acid esters, alkylbetaines, amineimides, amineoxides, etc.; and cationic surface active agents such as alkylamine salts, aliphatic quaternary ammonium salts, aromatic quaternary ammonium salts, heterocyclic quaternary ammonium salts (e.g., pyridinium, imidazolium, etc.), phosphonium or sulfonium salts having aliphatic or heterocyclic rings.

Practical examples of these surface active agents are described in, for example, U.S. Pat. Nos. 2,240,472, 2,831,766, 3,158,484, 3,210,191, 3,294,540, 3,507,660, 3,739,891, 2,823,123, 3,068,101, 3,415,649, 3,666,478, 3,756,828, 3,133,816, 3,441,413, 3,475,174, 3,545,974, 3,726,683, 3,843,368, 2,271,623, 2,288,226, 2,944,900, 3,253,919, 3,671,247, 3,722,021, 3,589,906, and 3,574,924, British Pat. Nos. 1,012,495, 1,022,878, 1,179,290, 1,198,450, 1,397,218, 1,138,514, 1,159,825, 1,374,780, 1,507,961 and 1,503,218, Belgian Pat. No. 731,126, West German Patent Application (OLS) No. 1,961,638, West German Patent Application No. 2,556,670, and Japanese Patent Application (OPI) Nos. 117414/75, 59025/75, 21932/78 and 77135/77.

The silver halide photographic emulsion layers or other hydrophilic colloid layers of the photographic materials used in this invention may further contain organic hardening agents such as, for example, chromium salts (chromium alum, chromium acetate, etc.), aldehydes (formaldehyde, glyoxal, glutaraldehyde, etc.), N-methylol compounds (dimethylol urea, methylol dimethylhydantoin, etc.), dioxane derivatives (2,3-dihydroxydioxane, etc.), active vinyl compounds (1,3,5-triacryloyl-hexahydro-s-triazine, bis(vinylsulfonyl)-methyl ether, etc.), active halogen compounds (2,4-dichloro-6-hydroxy-s-triazine, etc.), mucohalogenic acids (mucochloric acid, mucophenoxy-chloric acid, etc.), isooxazoles, dialdehyde starches, 2-chloro-6-hydroxytriazinylated gelatin, etc., solely or as a combination thereof. Practical examples of them are described in, for example, U.S. Pat. Nos. 1,870,354, 2,080,019, 2,726,162, 2,870,013, 2,983,611, 2,992,109, 3,047,394, 3,057,723, 3,103,437, 3,321,313, 3,325,287, 3,362,827, 3,539,644 and 3,543,292, British Pat. Nos. 676,628, 825,544, and 1,270,578, West German Pat. Nos. 872,153 and 1,090,427 and Japanese Pat. Publication Nos. 7133/59 and 1872/71.

The photographic materials used in this invention may further contain water-soluble dyes as filter dyes for other various purposes such as irradiation prevention and antihalation, etc., in the hydrophilic colloid layers thereof. Such dyes include oxonal dyes, hemioxonol dyes, styryl dyes, merocyanine dyes, cyanine dyes, and azo dyes. Among these dyes, oxonol dyes, hemioxonol dyes, and merocyanine dyes are useful. Practical examples of the dyes used in this invention are described in, for example, British Pat. Nos. 584,609 and 1,177,429, Japanese Pat. Application (OPI) Nos. 85130/73, 99620/74, 114420/74 and 108115/77, and U.S. Pat. Nos. 2,274,782, 2,533,472, 2,956,879, 3,148,187, 3,177,078, 3,247,127, 3,540,887, 3,575,704, 3,653,905, 3,718,472, 4,071,312 and 4,070,352.

When the hydrophilic colloid layers contain dyes or ultraviolet absorbents in the photographic materials used in this invention, they may be mordanted by cationic polymers such as described in, for example, British Pat. No. 685,475, U.S. Pat. Nos. 2,675,316, 2,839,401, 2,882,156, 3,048,487, 3,184,309 and 3,445,231, West German Pat. Application (OLS) No. 1,914,362 and Japanese Pat. Application (OPI) Nos. 47624/75 and 71332/75.

Also, at the practice of this invention, conventional fade preventing agents can be used in this invention, as well as dye image stablizers which can be used alone or as a mixture. Examples of the fade preventing agents used in this invention are the hydroquinone derivatives described in, for example, U.S. Pat. Nos. 2,360,290, 2,418,613, 2,675,314, 2,701,197, 2,704,713, 2,728,659, 2,732,300, 2,735,765, 2,710,801 and 2,816,028, and British Pat. No. 1,363,921, etc.; gallic acid derivatives described in U.S. Pat. Nos. 3,457,079 and 3,069,262; the p-alkoxy-phenols described in U.S. Pat. Nos. 2,735,765 and 3,698,909 and Japanese Pat. Publication Nos. 20977/74 and 6623/77; the p-oxyphenol derivatives described in U.S. Pat. Nos. 3,432,300, 3,573,050, 3,574,627, and 3,764,337 and Japanese Pat. Application (OPI) Nos. 35633/77, 147434/77 and 152225/77; and the bisphenols described in U.S. Pat. No. 3,700,455.

Moreover, the photographic materials of this invention may further contain ultraviolet absorbents in the hydrophilic colloid layers. Examples of the ultraviolet absorbents used in this invention are aryl-substituted benzotriazole compounds as described in, for example, U.S. Pat. No. 3,533,794; 4-thiazolidone compounds described in, for example, U.S. Pat. Nos. 3,314,794 and 3,352,681; benzophenone compounds described in, for example, Japanese Pat. Application (OPI) No. 2784/76; cinnamic acid esters described in, for example, U.S. Pat. Nos. 3,705,805 and 3,707,375; butadienes described in, for example, U.S. Pat. No. 4,045,229; and benzoxazoles described in, for example, U.S. Pat. No. 3,700,454. Furthermore, the ultraviolet absorbents described in U.S. Pat. No. 3,499,762 can be also used in this invention. Also, ultraviolet absorptive couplers (e.g., α-naphthol series cyan dye forming couplers) and ultraviolet absorptive polymers may be used. These ultraviolet absorbents may be mordanted to specific layers.

The photographic materials used in this invention may further contain hydroquinone derivatives, aminophenol derivatives, gallic acid derivatives, ascorbic acid derivatives, etc., as anti-color foggants. Practical examples of them are described in, for example, U.S. Pat. Nos. 2,360,290, 2,336,327, 2,403,721, 2,418,613, 2,675,314, 2,701,197, 2,704,713, 2,728,659, 2,732,300, and 2,735,765, Japanese Pat. Application (OPI) Nos. 92988/75, 92989/75, 93928/75, 110337/75 and 146235/77 and Japanese Pat. Publication No. 23813/75.

The photographic materials used in this invention may be processed by conventional processes and also using conventional processing solutions. The processing temperature is typically from 18° C. to 50° C. but may be lower than 18° C. or higher than 50° C.

The color developer used in this invention is generally an alkaline aqueous solution containing a color developing agent. As the color developing agent, known primary aromatic amine developing agents such as, for example, phenylenediamines (e.g., 4-amino-N,N-diethyl-aniline, 3-methyl-4-amino-N,N-diethylaniline, 4-amino-N-ethyl-N-β-hydroxyethylaniline, 3-methyl-4-amino-N-ethyl-N-β-hydroxyethylaniline, 3-methyl-4-amino-N-ethyl-N-β-methanesulfonamidoethylaniline, 4-amino-3-methyl-N-ethyl-N-β-methoxyethylaniline, etc.) can be used. Other examples of the color developing agents are described in L. F. A. Mason, *Photographic Processing Chemistry*, pages 226–229, published by Focal Press, 1966, U.S. Pat. Nos. 2,193,015 and 2,592,364 and Japanese Pat. Publication No. 64933/73.

The color developer used in this invention may further contain a pH buffer such as a sulfite, carbonate, borate, and phosphate of an alkali metal and a development inhibitor or an antifoggant such as a bromide, an iodide, and an organic antifoggant. Also, the color developer may, if necessary, contain a water softener, preservatives such as hydroxylamine, etc., an organic solvent such as benzyl alcohol, diethylene glycol, etc., a development accelerator such as polyethylene glycol, a quaternary ammonium salt, an amine, etc., a dye forming coupler, a competing coupler, a fogging agent such as sodium borohydride, etc., a tackifier, the polycarboxylic acid series chelating agents described in U.S. Pat. No. 4,083,723, and the antioxidants described in West German Pat. Application (OLS) No. 2,622,950.

The photographic materials are bleached after color development. The bleach treatment may be performed simultaneously with a fixing treatment or may be performed separately. As a bleaching agent, compounds of multivalent metals such as iron (III), cobalt (III), chromium (VI), copper (II), etc., peroxides, quinones, nitroso compounds, etc., are used. For example, there are ferricyanides, dichromates, organic complex salts of iron (III) or cobalt (III), aminopolycarboxylic acids such as ethylenediaminetetraacetic acid, nitrilotriacetic acid, 1,3-diamino-2-propanoltetraacetic acid, etc., the complex salts of organic acids such as citric acid, tartaric acid, maleic acid, etc., persulfates, permanganates, nitrosophenol, and the like. Among these compounds, potassium ferricyanide, ethylenediaminetetraacetic acid iron (III) sodium, and ethylenediaminetetraacetic acid iron (III) ammonium are particularly useful. Also, ethylenediaminetetraacetic acid iron (III) complex salts are used for bleach solution as well as a mono-bath type blix solution.

The bleach solution or blix solution used in this invention may further contain the bleach accelerators described in U.S. Pat. Nos. 3,042,520 and 3,241,966, Japanese Pat. Publication Nos. 8506/70 and 8836/70 and the thiol compounds described in Japanese Pat. Application (OPI) No. 65732/78.

A fix solution having a composition generally employed can be used in this invention. As a fixing agent, thiosulfates, thiocyanates and organic sulfur compounds having effect as fixing agent can be used. The fixing solution may further contain a water-soluble aluminum salt as a hardening agent.

Dye image formation may be accomplished in this manner.

The present invention is further illustrated by the following examples, however, it will be clear to those skilled in this art that numerous adaptations and modifications other than those listed below are possible.

EXAMPLE 1

Sample A was prepared by coating in order a transparent cellulose triacetate film with coating compositions for the following layer.

1st layer: A low-speed silver halide emulsion layer.

In a mixture of 60 ml of tricresyl phosphate, 120 ml of ethyl acetate, and 20 ml of dimethylformamide was dissolved 42 g of colored coupler (14) described before and the solution was dispersed by emulsification in 600 g of an aqueous 10% gelatin solution using 3 g of sodium nonylbenzenesulfonate to provide Emulsion I. To 700 g of a silver chlorobromide emulsion (silver: 0.42 mol, bromine content: 50 mol%) prepared in a conventional manner was added 700 g of Emulsion I and then an aqueous solution of 2 g of 2,4-dichloro-6-hydroxytriazine.sodium was added to the emulsion to provide the silver halide emulsion for the first emulsion layer.

2nd layer: An interlayer.

In a mixture of 100 ml of tricresyl phosphate and 100 ml of ethyl acetate was dissolved 50 g of 2,5-di-t-octylhydroquinone and the solution was dispersed by emulsification in an aqueous 10% gelatin solution as in preparing Emulsion I to provide Emulsion II. Then, 250 g of Emulsion II and an aqueous solution of 2,4-dichloro-6-hydroxytriazine.sodium were added to 1 kg of an aqueous 10% gelatin solution to provide a coating composition for the interlayer.

b 3rd layer: A high-speed silver halide emulsion layer.

In a mixture of 30 ml of tricresyl phosphate and 60 ml of ethyl acetate was dissolved 30 g of colorless coupler (A) shown below and the solution was dispersed by emulsification in 300 g of an aqueous 10% gelatin solution using 1.5 g of sodium nonylbenzenesulfonate to provide Emulsion III. Then, 300 g of Emulsion III and 810 ml of an aqueous solution of 4% colored coupler (5) were mixed with 390 g of a silver chloroiodobromide emulsion (silver content: 0.24%, iodine content: 0.5 mol%, bromine content: 70 mol%) prepared in an ordinary manner and an aqueous solution of 2,4-dichloro-6-hydroxytriazine.sodium was added thereto as a hardening agent to provide the silver halide emulsion for the second emulsion layer. Colorless coupler (A):

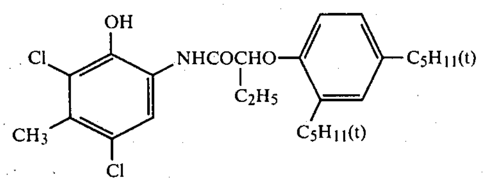

4th layer: A protective layer.

To 1 kg of an aqueous 10% gelatin solution was added an aqueous solution of 1 g of sodium nonylbenzenesulfonate.

Figure 7:
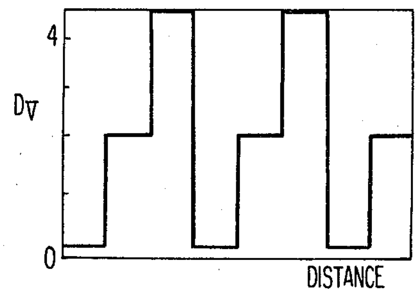
FIG. 7 is the density curve of the neutral filter used in Example 1.

Sample A thus prepared was exposed to a white light source at 1,000 CMS by closely contacting a black stripe filter (line width of 100 microns) having transmission densities of 0.05, 2.0 and higher than 4.0 as shown in FIG. 7 and then processed at 33° C. as follows:

| | |
|---|---|
| 1. Color development | 3.5 min |
| 2. Blix | 1.5 min |
| 3. Wash | 3 min |

The compositions of the processing solutions used in the above processings were as follows:

| Color Developer: | |
|---|---|
| Benzyl Alcohol | 15 ml |
| $Na_2SO_3$ | 3 g |
| KBr | 0.4 g |
| Hydroxylamine Sulfate | 2 g |
| 4-Amino-3-methyl-N-ethyl-N-β-(methanesulfonamido)ethylaniline | 5 g |
| $Na_2CO_3$ | 30 g |
| Diethylenetriamine Pentaacetic Acid | 5 g |
| Water to make | 1,000 ml |
| | pH 10.1 |

| Blix Solution: | |
|---|---|
| Ammonium Thiosulfate (70 wt %) | 150 ml |
| $Na_2SO_3$ | 15 g |
| Na[Fe(EDTA)] | 40 g |
| EDTA | 4 g |
| Water to make | 1,000 ml |
| | pH 6.9 |

Figure 8:
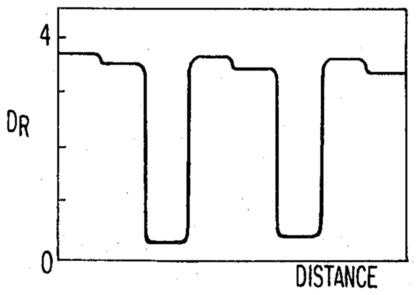
FIG. 8 is the density curve for the red density of the multicolor optical filter obtained by the processing in Example 1.
Figure 9:
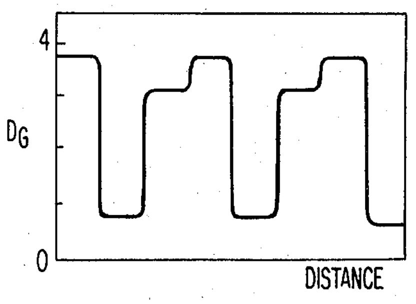
FIG. 9 is the density curve for the green density of the multicolor optical filter obtained by the processing in Example 1.
Figure 10:
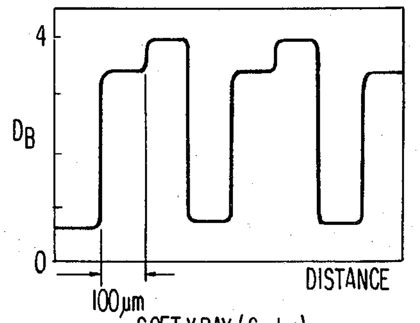
FIG. 10 is the density curve for the blue density of the multicolor optical filter obtained by the processing in Example 1.
Figure 11:
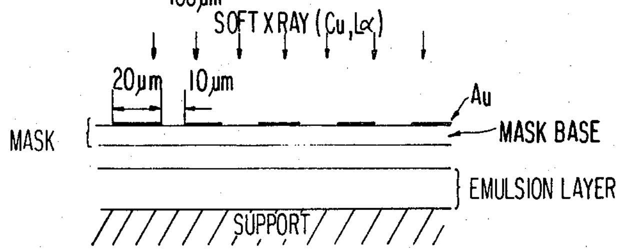
FIG. 11 is a schematic view showing the exposure method used in Example 2, wherein after shifting the mask by 10 microns, the photographic material is re-exposed.

The red transmission density, green transmission density, and blue transmission density of the sample thus processed were measured by a scanning Micro Photometer FMP Model S (made by Fuji Photo Film Co., Ltd.) and the results are shown in FIG. 8, FIG. 9 and FIG. 10, respectively.

As is clear from the above results, a red, green and blue stripe color line image could be prepared by the process of this invention.

EXAMPLE 2

Figure 12:
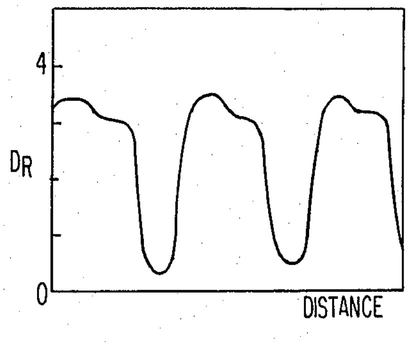
FIG. 12 to FIG. 14 show the density distributions of red, green, and blue colors respectively for the multicolor optical filter obtained in Example 2.
Figure 13:
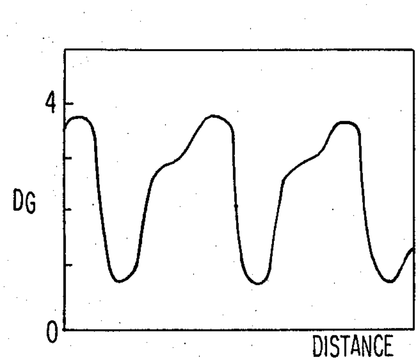
Figure 14:
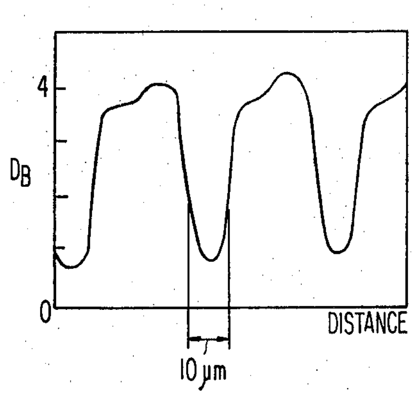

Sample A prepared in the same manner as in Example 1 was exposed to soft X-rays (Cu, Lα line) for 3 seconds through a gold stripe mask prepared by vapor-depositing gold on a silicon base plate at a line width of 20 μm with an interval of 10 μm and then after shifting the mask on the surface of the silver halide emulsion layer in a direction perpendicular to the stripe by 10 μm, the sample was exposed again for 5 minutes. The sample thus exposed was processed and the transmission densities were measured in the same manner as in Example 1. The results are shown in FIG. 12, FIG. 13 and FIG. 14. Thus, a red, green and blue stripe form color line image was obtained.

EXAMPLE 3

Figure 15:
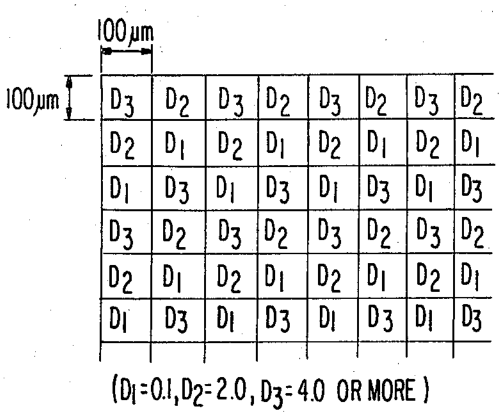
FIG. 15 shows a filter pattern used in Example 3.
Figure 16:
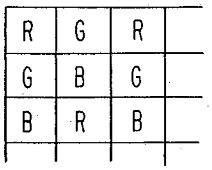
FIG. 16 shows the color distribution of the multicolor optical filter obtained in Example 3.

A sample prepared by the same manner as in Example 1 was exposed to a white light source at 1,000 CMS through a black pattern filter as shown in FIG. 15 and processed as in Example 1. Thus, a color image having the pattern as shown in FIG. 16 was obtained.

While the invention has been described in detail and with reference to specific embodiments thereof, it will be apparent to one skilled in the art that various changes and modifications can be made therein without departing from the spirit and scope thereof.

What is claimed is:

1. A process of producing a multicolor optical filter which comprises:

exposing a multilayer color photographic material comprising: (1) a silver halide emulsion layer containing a colored coupler (1b) colored cyan, magenta or yellow and forming a dye having one of the other two principal colors by coupling reaction with the oxidation product of an aromatic primary amine color developing agent, and (2) a silver halide emulsion layer (2) containing a silver halide emulsion (2a) having a sufficiently high sensitivity that upon exposure that does not produce an image in emulsion layer (1) upon development, an image is produced in emulsion layer (2) and containing a colored coupler (2b) having the same color as that of the dye formed by the coupling reaction of the colored coupler (1b) in emulsion layer (1) and forming a cyan, magenta or yellow dye other than the color of the colored coupler (1b) or the color of the dye formed by coupling reaction of the colored coupler (1b);

said exposure being such that a portion of the material is unexposed and no image-wise development occurs in the silver halide emulsion layer (1) or (2), a portion is exposed in an amount sufficient to increase the coupling color density of the silver halide emulsion layer (2) and no image-wise development occurs in silver halide emulsion layer (1), and the remaining portion is exposed in an amount sufficient to produce image-wise development of the silver halide emulsion layer (1); and processing the color photographic material in color developer containing an aromatic primary amine color developing agent.

2. The process of claim 1, wherein the color photographic material comprises a silver halide emulsion layer containing a magenta colored yellow coupling coupler and a silver halide emulsion layer containing a cyan colored magenta coupling coupler.

3. The process of claim 1, wherein the color photographic material comprises a silver halide emulsion layer containing a magenta colored cyan coupling coupler and a silver halide emulsion layer containing a yellow colored magenta coupling coupler.

4. The process of claim 1, wherein the color photographic material comprises a silver halide emulsion layer containing a cyan colored magenta coupling coupler and a silver halide emulsion layer containing a yellow colored cyan coupling coupler.

5. The process of claim 1, wherein the color photographic material comprises a silver halide emulsion layer containing a cyan colored yellow coupling coupler and a silver halide emulsion layer containing a magenta colored cyan coupling coupler.

6. The process of claim 1, wherein the color photographic material comprises a silver halide emulsion layer containing a yellow colored magenta coupling coupler and a silver halide emulsion layer containing a cyan colored yellow coupling coupler.

7. The process of claim 1, wherein the color photographic material comprises a silver halide emulsion layer containing a yellow colored cyan coupling coupler and a silver halide emulsion layer containing a magenta colored yellow coupling coupler.

8. The process of claim 1, wherein the color photographic material is exposed through a filter or mask having a stripe or mosaic pattern.

* * * * *